United States Patent
Nowell et al.

(10) Patent No.: US 11,132,037 B2
(45) Date of Patent: Sep. 28, 2021

(54) OPERATING TEMPERATURE MANAGEMENT OF A MEMORY SUB-SYSTEM

(71) Applicant: Micron Technology, Inc., Boise, ID (US)

(72) Inventors: Shane Nowell, Boise, ID (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 341 days.

(21) Appl. No.: 16/123,189

(22) Filed: Sep. 6, 2018

(65) Prior Publication Data
US 2020/0081507 A1 Mar. 12, 2020

(51) Int. Cl.
G06F 11/30 (2006.01)
G06F 1/20 (2006.01)
G01K 3/00 (2006.01)
G11C 11/56 (2006.01)

(52) U.S. Cl.
CPC ............. *G06F 1/206* (2013.01); *G01K 3/005* (2013.01); *G06F 1/203* (2013.01); *G11C 11/5635* (2013.01)

(58) Field of Classification Search
CPC ....................................................... G06F 1/206
See application file for complete search history.

(56) References Cited

U.S. PATENT DOCUMENTS

| 2001/0014049 A1 | 8/2001 | Woo et al. |
| 2015/0043281 A1* | 2/2015 | Hemink .............. G11C 11/5642 365/185.18 |
| 2018/0158492 A1* | 6/2018 | Lee ..................... G11C 11/1695 |

FOREIGN PATENT DOCUMENTS

| KR | 1020140035916 A | 3/2014 |
| KR | 1020170019444 A | 2/2017 |
| KR | 1020180064617 A | 6/2018 |

OTHER PUBLICATIONS

PCT Notification of Transmittal of the International Search Report and the Written Opinion of the International Searching Authority for PCT Application No. PCT/US2019/049798, dated Dec. 24, 2019, 12 pages.

* cited by examiner

*Primary Examiner* — Phuong Huynh
(74) *Attorney, Agent, or Firm* — Lowenstein Sandler LLP (57) ABSTRACT

An operating temperature of a memory sub-system is identified. It is determined that the identified operating temperature satisfies a first temperature condition. Upon determining that the identified operating temperature satisfies the first temperature condition, operations are performed at the memory sub-system until the operating temperature changes to satisfy a second temperature condition.

20 Claims, 6 Drawing Sheets

OPERATING TEMPERATURE MANAGEMENT OF A MEMORY SUB-SYSTEM

TECHNICAL FIELD

Embodiments of the disclosure relate generally to memory sub-systems, and more specifically, relate to operating temperature management of a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to management of memory sub-system operating temperature. A memory sub-system is also hereinafter referred to as a "memory device". An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. The memory components can include memory cells that are used to store data. Each memory component can include a different type of media. Examples of media include, but are not limited to, a cross-point array of non-volatile memory and flash based memory such as single-level cell (SLC) memory, multi-level-cell (MLC) memory, such as triple-level cell (TLC) memory, quad-level cell (QLC) memory, etc. Using the example of a flash based memory, a quad-level cell (QLC) can store four bits of data while a single-level cell (SLC) can store one bit of data. Accordingly, a memory component including QLC memory will have a higher data density than a memory component including SLC memory.

Each memory cell can store data values as a threshold voltage for that particular memory cell. For example, when storing one bit of data in the SLC memory, a range of possible threshold voltages of a memory cell is divided into two ranges. Data can be stored at a higher density MLC memory based on a total threshold voltage range that is divided into distinct threshold voltage ranges for the memory cells. For example, the range of possible threshold voltages for memory cells of a QLC memory can be divided into four ranges (e.g., a different threshold voltage range for each bit of the data). Each distinct threshold voltage range corresponds to a predetermined value for the data stored at the memory cell.

Conventional memory sub-systems can store multiple bits of data in a single memory cell by mapping sequences of bits of the data to the different threshold voltage ranges of the memory cell. The data can be stored into the memory cell by using a programming operation that applies a sequence of programming pulses to the memory cell. The sequence of programming pulses can be applied to the memory cell until a voltage level within a corresponding threshold voltage range has been reached at the memory cell. After the memory cell has been programmed, data can be read from the memory cell by applying a read threshold voltage to the memory cell at the corresponding threshold voltage range and translating the programed voltage level at the memory cell.

Under certain circumstances, the memory sub-system can be operated in an environment with varying temperature. In such cases, the integrity of the data stored in the memory cells can be adversely affected. For example, the voltage level associated with a memory cell can shift from being detected at a particular read threshold voltage as the temperature of the memory sub-system changes. Even minor temperature variations over time, such as a period of time between when data is written to a memory cell and when data is read from the memory cell, can impact the voltages stored in and read from the memory cell. In addition, the amount that the voltage level shifts can change as the change in temperature increases over time. In other words, the voltage level shift per degree Celsius can be larger or smaller at extreme temperatures (e.g., closer to 0° C. for extreme low temperature, or 70° C. for extreme high temperature) than it is in a more moderate range (e.g., 15° C. to 30° C.). In other examples, extreme temperature conditions can have even more extreme ranges. Additionally, the voltage level shift per degree Celsius can vary depending on material properties of the particular memory sub-system. This shift can result in increased raw bit error rate (RBER) which can be beyond the error correction capability of the underlying error correction code (ECC). The increased RBER can be problematic when translating voltages into data values that correspond to various threshold voltage ranges of the memory cell. As the temperature decreases to a certain level (e.g., to 0 (° C.)), threshold voltage distributions widen and shifts resulting in increased RBER as a result of an incorrect voltage level association with the memory cells. Additionally, the error rate can be high even when the data is written at one extreme temperature and read at the same extreme temperature.

High error rates cause degradation of the performance of a memory sub-system. For example, if the data stored at the memory sub-system includes a higher number of errors as a result of the temperature variation effect, then the data cannot be recovered until the temperature variation effect is removed. The problem can be acute in devices and applications that are used in varying temperatures, such as, automotive applications, data collection in the field, mobile applications where the mobile device (e.g., a mobile phone) can go from near body temperature to near freezing temperature within moments, etc. A temperature compensation value can be used to apply a linear offset in voltage based on the temperature difference. For example, the temperature compensation value can be used to specify a particular read voltage level to apply to a memory cell to account for a shift in the threshold voltage distributions of the memory cell. However, the application of such a temperature compensation value is often limited to a narrow range of temperatures and not for extreme operating temperatures or extreme difference in temperature.

Aspects of the present disclosure address the above and other deficiencies by managing the operating temperature of the memory sub-system by performing various operations (e.g., read operations, write operations, etc.) at the memory sub-system. The operating temperature of the memory sub-system can be monitored. A determination can be made as to whether the operating temperature satisfies a temperature condition (e.g., operating temperature being below one threshold or above another threshold). If the temperature condition is satisfied, operations can be performed to increase or decrease the operating temperature until the operating temperature reaches the threshold temperature. The operations can include useful operations and/or dummy operations.

The present disclosure reduces or eliminates the effects of extreme temperature conditions and extreme temperature differences for the memory sub-system. Advantages of the present disclosure include, but are not limited to, the increased performance of the memory sub-system as operations can be performed more efficiently and optimally, minimizing latency, in varying temperature conditions and without wasting computing resources on performing error correction operations. As a result, the error rate in the memory sub-system can be decreased or eliminated as the shifting of the threshold voltage distributions associated with the memory cells of the memory sub-subsystem can be decreased. Accordingly, error correction operations can be utilized less frequently, and the overall performance of the memory sub-system can be improved as other read operations or write operations can be performed by the memory sub-system instead of additional error correction operations.

Figure 1:
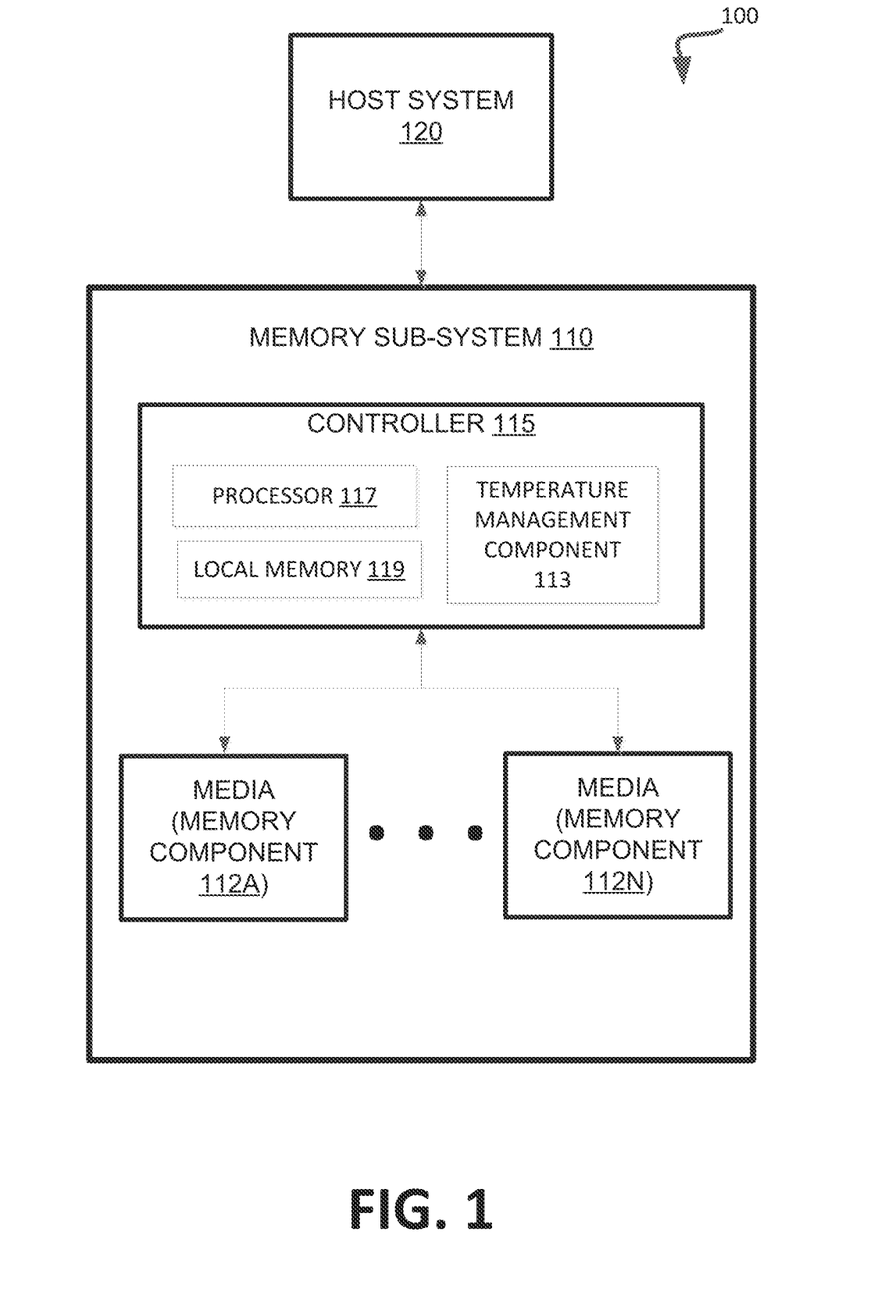
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a temperature management component 113 that can be used to manage operating temperature of the memory sub-system 110. In some embodiments, the controller 115 includes at least a portion of the temperature management component 113. For example, the controller 115 can include a processor 117 (processing device) configured to execute instructions stored in local memory 119 for performing the operations described herein. In some embodiments, the temperature management component 113 is part of the host system 110, an application, or an operating system.

The temperature management component 113 can identify an operating temperature of the memory sub-system 110. The temperature management component 113 can determine that the identified operating temperature satisfies a first temperature condition (e.g., the operating temperature being below a threshold temperature) and perform operations (e.g., write operations, erase operations, etc.) at the memory sub-system 110 until the operating temperature changes to satisfy a second temperature condition (e.g., the operating temperature reaching above the threshold temperature). Further details with regards to the operations of the temperature management component 113 are described below.

Figure 2A:
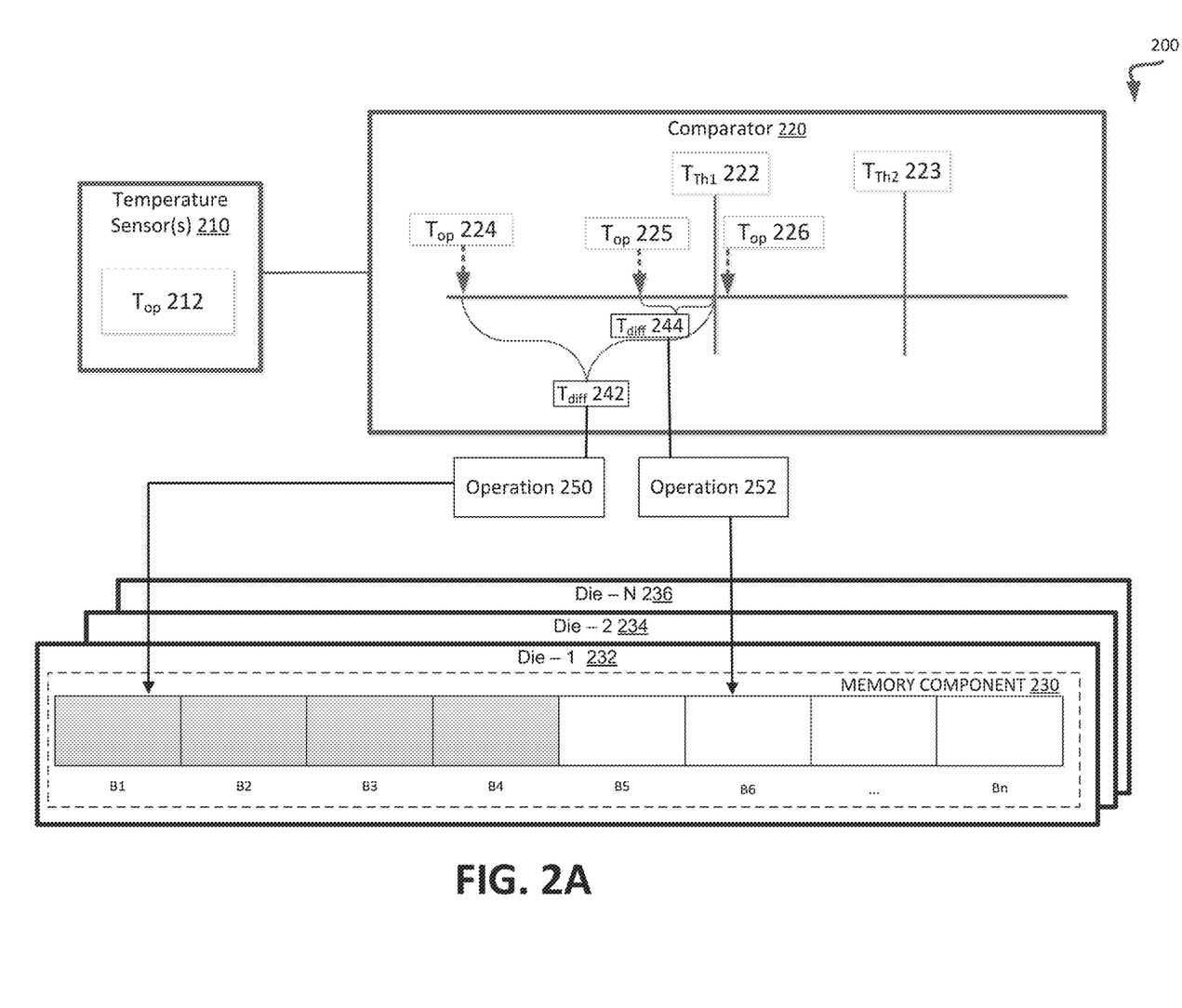
FIG. 2A illustrates an example of performing operations on a data block at a memory component of a memory sub-system for management of temperature in accordance with some embodiments of the present disclosure.

FIG. 2A illustrates an example of performing operations on a data block at a memory component 230 of a memory sub-system 200 for management of temperature in accordance with some embodiments of the present disclosure. In general, the memory sub-system 200 can correspond to the memory sub-system 110 of FIG. 1. For example, the memory sub-system 110 can include temperature management component 113 of FIG. 1. In some embodiments, the temperature management component 113 can be configured to identify an operating temperature associated with the memory sub-system 200. An operating temperature can be the current temperature at which the memory sub-system 200 is operating. The temperature management component 113 can further be configured to perform temperature management by performing operations (e.g., read, write, etc.) based on the identified operating temperature.

As shown, the memory component 230 can be organized into multiple blocks B1-$n$. The blocks B1-$n$ each include multiple memory pages that can correspond to portions of the memory component 230. The size and configuration of the blocks B1-$n$ can vary. For example, each of the blocks B1-$n$ can include any number of memory pages, and each memory page can have an associated storage capacity for storing data. In one embodiment, each memory page can include a number of multi-level memory cells. In one embodiment, the memory sub-system 110 can include one or more memory dies 232, 234 and 236. Each die can include a separate memory component, such as memory component 230, organized into one or more memory blocks. As shown, die 232 includes memory component 230, which includes one or more of data blocks B1-$n$.

Data can be programmed (e.g., written), read, and/or erased from the memory pages of the blocks B1-$n$. In some implementations, the memory pages can correspond to a group of memory cells that are read and/or programmed together. The memory cells can be programmed using an iterative programming process. In this type of process, a sequence of programming pulses is applied to a group of memory cells until the desired voltage levels in the memory cells is reached. Once the memory cells have been programmed, data can be read from the memory cells by translating the programed voltage level of the memory cells.

In some embodiments, the memory sub-system can identify a temperature at which the memory sub-system 200 is operating. Temperature information associated with the memory component 230 can be obtained in several ways. For example, the temperature information can include an operating temperature $T_{op}$ 212 from one or more temperature sensors 210 located in and/or around memory component 230 and/or temperature measurements from other temperature sensors that are associated with other components of memory sub-system 110 (e.g., controller 115). The memory sub-system 200 can obtain operating temperature $T_{op}$ 212 measurements from the temperature sensors 210 to determine whether the memory sub-system 110 is operating at a temperature outside of specified threshold ranges of temperature. In some implementations, the temperature sensors 210 can be configured to periodically and at predefined intervals measure the operating temperature $T_{op}$ 212 and to provide an indication of the measured operating temperature $T_{op}$ 212 to the memory sub-system 200. In other implementations, the temperature sensors 210 can measure the operating temperature $T_{op}$ 212 responsive to one or more commands or queries that can be sent by the memory sub-system 200, such as a command to measure operating temperature $T_{op}$ 212. Depending on the embodiment, the current temperature can include at least one of a temperature of the semiconductor die 232 on which memory component 230 is fabricated, an operating temperature of the memory sub-system 200, or an ambient temperature in an area where memory sub-system 200 is located.

The memory sub-system 200 can perform a temperature comparison operation using a comparator 220 to determine whether the operating temperature of the memory sub-system 200 satisfies a temperature condition. The comparator 220 can be a software module, an application, or a hardware module such as an integrated circuit, a microcontroller, special purpose logic circuitry (e.g., a field programmable gate array (FPGA), an application specific integrated circuit (ASIC), etc.), or other suitable processor. In an example, a temperature condition can be defined as the operating temperature being below a threshold temperature. In another example, the temperature condition can be defined as the operating temperature being above a threshold temperature. As shown in FIG. 2A, the memory sub-system 200 can specify one or more threshold temperatures, a first threshold temperature $T_{Th1}$ 222 and/or a second threshold temperature $T_{Th2}$ 223. The threshold temperatures can indicate an optimal or expected operating temperature for the memory sub-system 200, or a range of such temperatures. For example, an optimal operating temperature range can be between $T_{TH1}$ 222 and $T_{Th2}$ 223.

In an implementation, comparator 220 can determine whether the operating temperature of the memory sub-system 200 satisfies a first temperature condition. In an example, the first temperature condition can be defined as the operating temperature being below the first threshold temperature $T_{Th1}$ 222 (e.g., 25° C.) as specified in the memory sub-system 200. FIG. 2A shows an identified operating temperature $T_{op}$ 224 at one point in time. Comparator 220 can compare the first threshold temperature $T_{Th1}$ 222 and the identified operating temperature $T_{op}$ 224. The comparator 220 can determine that the identified operating temperature $T_{op}$ 224 is below the first threshold temperature $T_{Th1}$ 222. Similarly, comparator 220 can compare the first threshold temperature $T_{Th1}$ 222 and an identified operating temperature $T_{op}$ 225 at another point in time. The comparator 220 can determine that the identified operating temperature $T_{op}$ 225 is below the first threshold temperature $T_{Th1}$ 222.

In an example, the comparator 220 can determine that the operating temperature of the memory sub-system satisfies a first temperature condition during startup of a device containing the memory sub-system. For example, a user can bring a computing device from a cold environment (e.g., 5° C.) outdoors to a room temperature environment (e.g., 25° C.) indoors and start the device. During startup of the device, the memory sub-system can query to identify an operating temperature of the memory sub-system and determine that the device including the memory sub-system is below the threshold temperature (e.g., too cold). In another example, the determination that the operating temperature is below the threshold can be made at the startup of a data center device containing a memory sub-system where the device is started for the first time and remains in similar temperature conditions throughout. In another example, a user can start taking photos using a mobile camera (that includes a memory sub-system) indoors at 30° C., for example, and then moves outdoors to a cold environment (e.g., 10° C.) to continue taking photos on the mobile camera. As the operating temperature starts to drop to the outdoor temperature of 10° C., the memory sub-system can identify the operating temperature and determine that the operating temperature is below the specified threshold temperature.

Upon determining that the identified operating temperature satisfies the first temperature condition, the memory sub-system 200 can perform one or more operations (e.g., program operation, read operation, etc.) to increase the operating temperature of the memory sub-system 200. The operations ("temperature management operations") can be performed on one or more data blocks B1-$n$ of Die-1 232 of the memory component 230 of the memory sub-system 200. The operations can additionally or alternatively be performed on data blocks on other die 234 and/or 236, etc. As the operations are performed, for a programming (e.g., write) operation, sequence of programming voltage pulses can be applied to the memory cell of a data block until a voltage level within a corresponding threshold voltage range has been reached at the memory cell. For a read operation, data can be read from the memory cell by applying a read threshold voltage to the memory cell at the corresponding threshold voltage range and translating the programed voltage level at the memory cell. The memory sub-system operating temperature can thus be increased through resistive heating as a result of the application of a voltage to a memory cell. Thus, the operations have voltage consumptions associated with the operations and as a result, the performing the operations can increase the operating temperature of the memory sub-system.

As shown in FIG. 2A, upon the comparator 220 determining that the identified operating temperature $T_{op}$ 224 satisfies the first temperature condition, that is, the operating temperature $T_{op}$ 224 is below the first threshold temperature $T_{Th1}$ 222, the memory sub-system can start performing an operation 250 on data block B1 of memory component 230. Similarly, upon the comparator 220 determining that the identified operating temperature $T_{op}$ 225 satisfies the first temperature condition, that is, the operating temperature $T_{op}$ 225 is below the first threshold temperature $T_{Th1}$ 222, the memory sub-system can start performing an operation 252 on data block B6 of memory component 230. As the operation 250 or operation 252 is performed, the operating temperature of the memory sub-system can start to increase.

The memory sub-system 200 can perform one or more operations to manage the operating temperature. The memory sub-system 200 can identify the operating temperature for the memory sub-system 200 after operations are performed to assess the temperature condition of the memory sub-system 200. The comparator 220 can determine that the operating temperature has changed to satisfy a second temperature condition. In an example, the second temperature condition can be defined as the operating temperature being above the first threshold temperature $T_{Th1}$ 222 (e.g., 25° C.) as specified in the memory sub-system 200. In another example, the second temperature condition can be defined as the operating temperature being above another threshold temperature $T_{Th3}$ (e.g., 28° C.) (not shown) as specified in the memory sub-system 200. For example, after performing operation 250 or 252, the operating temperature of the memory sub-system 200 can still be below the first threshold temperature $T_{Th1}$ 222. The memory sub-system can continue to perform operation 250 or 252 (or additional operations) on data blocks B1 or B6, or on additional data blocks (e.g., B2, B7, etc.) until the operating temperature changes to satisfy the second temperature condition. After continuing to perform the operations 250 or 252, the operating temperature of the memory sub-system 200 can reach $T_{op}$ 226, which is above the first threshold temperature $T_{Th1}$ 222. Once the second temperature condition is satisfied, the memory sub-system can cease to perform operation 250 or 252 or any additional operations. Once the operating temperature of the memory sub-system is within an acceptable range of temperatures as specified in the memory sub-system, the memory sub-system can continue performing routine operations, such as, read or write data requested by the host system.

The operations performed by the memory sub-system can be any operation that produces resistive heating. The operations can include a read operation associated with one or more of the data blocks B1-$n$ at the memory component 230 or other memory components, a write operation (e.g., a program operation) associated with one or more of the data blocks B1-$n$ at the memory component 230 or other memory components; an erase operation associated with one or more of the data blocks B1-$n$ at the memory component 230 or other memory components, etc. In some embodiments, the memory sub-system can perform a combination of operations (e.g., a combination of program and erase operation, a combination of write and read operations, etc.).

The operations can include dummy operations (e.g., operations that are not necessary for any other purposes than to increase temperature, or have not been requested by the host system, etc.). For example, the operations can include reading data that has been written to the data blocks of the memory sub-system without receiving any read requests. The operations can include useful operations with the purpose of increasing the operating temperature, such as, an erase operation that would have been performed at a next erase cycle. Instead of waiting for the ease cycle, the erase operation can be initiated by the memory sub-system when an operation needs to be performed to increase the operating temperature.

In some embodiments, different types of operations can be performed based on the difference between the identified operating temperature and the specified threshold temperature. The memory sub-system can specify ranges of difference between the operating temperature and the threshold temperature and identify each range as low, medium, high, or provide some other ranking for the level of difference. For example, a read operation can be a low voltage operation and thus can be performed when the difference between the operating temperature and the threshold temperature is identified as a low difference. On the other hand, an erase operation can be a higher voltage operation and thus can be performed when the difference between the operating temperature and the threshold temperature is identified as a higher difference. In an example, the difference between operating temperature $T_{op}$ 225 and threshold temperature $T_{Th1}$ 222 can be $T_{diff}$ 244, which can be identified as a low (e.g., small) difference as specified by the memory sub-system. Based on the difference being low, operation 252 can be performed, which can be a read operation. In another example, the difference between operating temperature $T_{op}$ 224 and threshold temperature $T_{Th1}$ 222 can be $T_{diff}$ 242, which can be identified as a high (e.g., large) difference as specified by the memory sub-system. Based on the difference being high, operation 250 can be selected to be performed, which can be an erase operation.

In some embodiments, particular blocks can be dedicated to perform the temperature management operations. For example, when data is written to or erased from a data block, it can cause damages to the data block. On the other hand, a read operation does not cause damage to the data block. When the memory sub-system needs to limit damages to the data blocks, a read operation can be performed using any data block available. However, the memory sub-system can dedicate a particular group of data blocks B1-B4, for example, to perform dummy operations that include program or erase operations. The dedicated group of data blocks B1-B4 can be data blocks that are already identified as damaged, nearly damaged, empty, non-functional, and/or are not suitable for other useful operations. Alternatively, the dedicated group of data blocks B1-B4 can be data blocks that are only to be used for the temperature management operations such that the dummy operations can be performed on the dedicated data blocks repeatedly and without damaging other data blocks that can be used for useful operations.

In some embodiments, the temperature management operations can be performed on data blocks on a memory component 230 on die 232. The operations can increase operating temperature of the memory component 230 on die 232. The increasing of temperature of die 232 can also increase operating temperature of die 234, and die 236 by the virtue of being situated adjacent to die 232. Thus, the technology can heat a first die using temperature management operations and as a result heat other adjacent die that are located within the same stack of die as the first die.

Figure 2B:
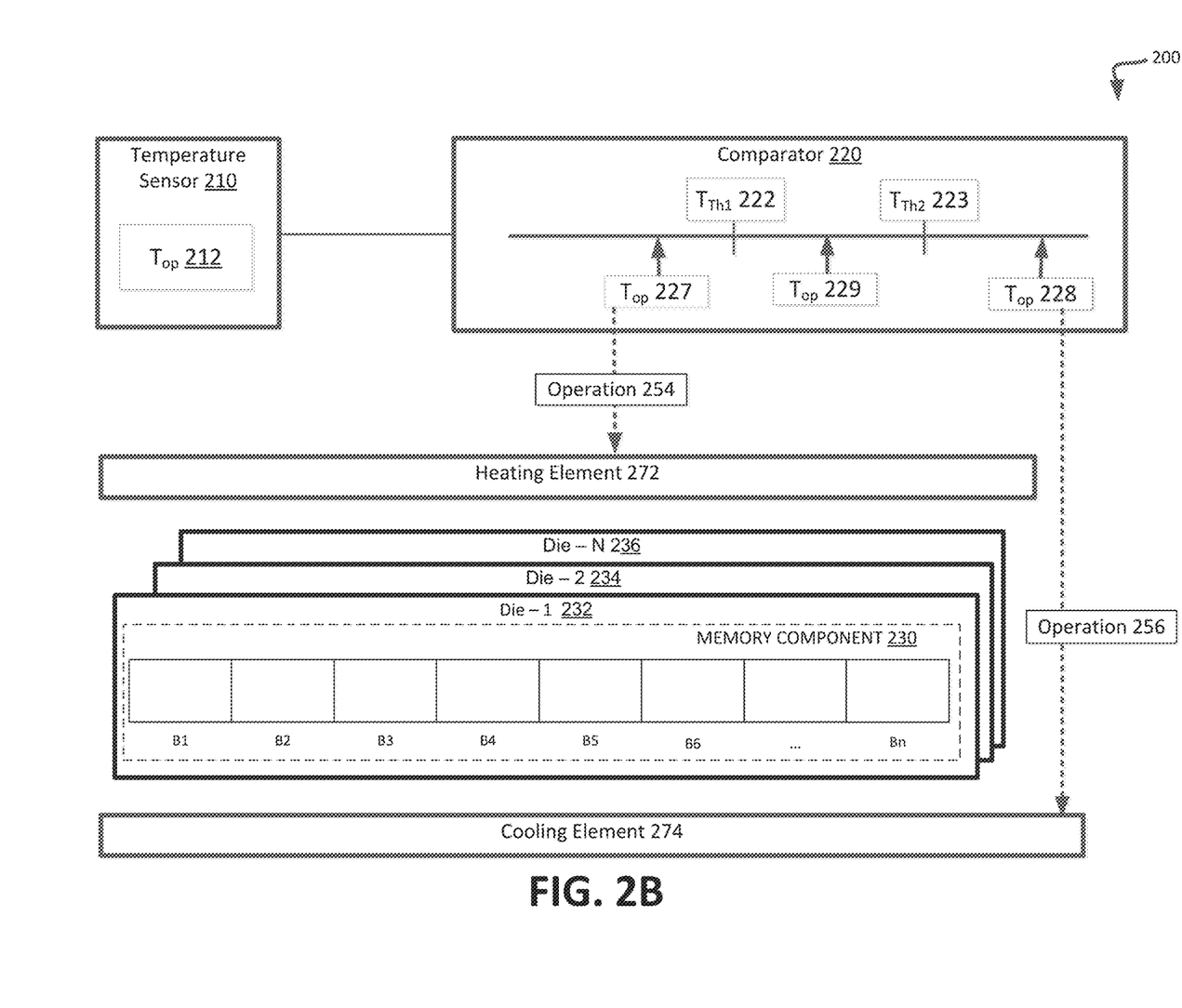
FIG. 2B illustrates an example of performing operations associated with a temperature control element that is proximate to a memory component of a memory sub-system in accordance with some embodiments of the present disclosure.

FIG. 2B illustrates another example of performing operations at the memory sub-system 200 of FIG. 2A in accordance with some embodiments of the present disclosure. In this example, the memory sub-system 200 can include one or more temperature control elements that are proximate to the memory component 230 of the memory sub-system 200. Operations associated with the one or more temperature control elements can be performed to manage operating temperature of the memory sub-system 200. The temperature control elements can be placed within or adjacent to the die 232, 234, 236, etc., or another component within the memory sub-system 200. In some embodiments, the temperature control elements can be included within a hardware package. The temperature control elements can include one or more heating elements 272 and/or one or more cooling elements 274. In one example, heating element 272 can include a resistor. Heating can also be achieved with chemical reactions, nuclear reactions, or obtaining heat in from an internal or external source (e.g., heat pipe from the processor). In an example, cooling element 274 can include a fan, a heat-sink metal, peltier junctions, evaporative or heat transport mechanisms (e.g., heat pipes), other internal or external devices, etc.

As described with respect to FIG. 2A, comparator 220 can determine whether the operating temperature of the memory sub-system 200 satisfies a first temperature condition. In an example, the first temperature condition can be defined as the operating temperature being below the first threshold temperature $T_{Th1}$ 222 (e.g., 25° C.) as specified in the memory sub-system 200. FIG. 2B shows an identified operating temperature $T_{op}$ 227 at one point in time. Comparator 220 can compare the first threshold temperature $T_{Th1}$ 222 and the identified operating temperature $T_{op}$ 227. The comparator 220 can determine that the identified operating temperature $T_{op}$ 227 is below the first threshold temperature $T_{Th1}$ 222.

Upon determining that the identified operating temperature satisfies the first temperature condition, the memory sub-system 200 can perform one or more operations associated with a temperature control element. Upon determining that the identified operating temperature $T_{op}$ 227 is below the first threshold temperature $T_{Th1}$ 222, the memory sub-system 200 can perform an operation 254 associated with one or more heating elements 272 to increase the operating temperature of the memory sub-system 200. The operation 254 can initiate resistive heating using the heating element 272.

The memory sub-system 200 can identify the operating temperature after operation 254 is performed to assess the temperature condition of the memory sub-system 200. The memory sub-system can continue to perform operation 254 until the operating temperature changes to satisfy a second temperature condition. The second temperature condition can be defined as the operating temperature being above the first threshold temperature $T_{Th1}$ 222 (e.g., 25° C.), or above another threshold temperature $T_{Th3}$ (e.g., 28° C.) (not shown), as specified in the memory sub-system 200. The comparator 220 can determine that the operating temperature has changed to satisfy the second temperature condition when the operating temperature changes to $T_{op}$ 229, which is above the first threshold temperature $T_{Th1}$ 222. Once the second temperature condition is satisfied, the memory sub-system can cease to perform operation 254.

In another example, the first temperature condition can be defined as the operating temperature being above a second threshold temperature $T_{Th2}$ 223 as specified in the memory sub-system 200. FIG. 2B shows an identified operating temperature $T_{op}$ 228 at one point in time. Comparator 220 can compare the second threshold temperature $T_{Th2}$ 223 and the identified operating temperature $T_{op}$ 228. The comparator 220 can determine that the identified operating temperature $T_{op}$ 228 is above the second threshold temperature $T_{Th2}$ 223.

Upon determining that the identified operating temperature $T_{op}$ 228 is above the second threshold temperature $T_{Th2}$ 223, the memory sub-system 200 can perform an operation 256 associated with one or more cooling elements 274 to decrease the operating temperature of the memory sub-system 200. The operation 256 can initiate a cooling action using the cooling element 274.

The memory sub-system 200 can identify the operating temperature after operation 256 is performed to assess the temperature condition of the memory sub-system 200. The memory sub-system can continue to perform operation 256 until the operating temperature changes to satisfy a second temperature condition. The second temperature condition can be defined as the operating temperature being below the second threshold temperature $T_{Th2}$ 223, or below another threshold temperature $T_{Th3}$ (not shown), as specified in the memory sub-system 200. The comparator 220 can determine that the operating temperature has changed to satisfy the second temperature condition when the operating temperature changes to $T_{op}$ 229, which is below the second threshold temperature $T_{Th2}$ 223. Once the second temperature condition is satisfied, the memory sub-system can cease to perform operation 256.

In some embodiments, as it relates to both FIGS. 2A and 2B, operations to manage the operating temperature of the memory sub-system can be performed when the cost of power and energy is inexpensive or power is easily available. For example, when the device containing the memory sub-system is connected to a power source rather than running on battery power, the memory sub-system can perform the temperature management operations, as resistive heating consumes battery power.

Figure 3A:
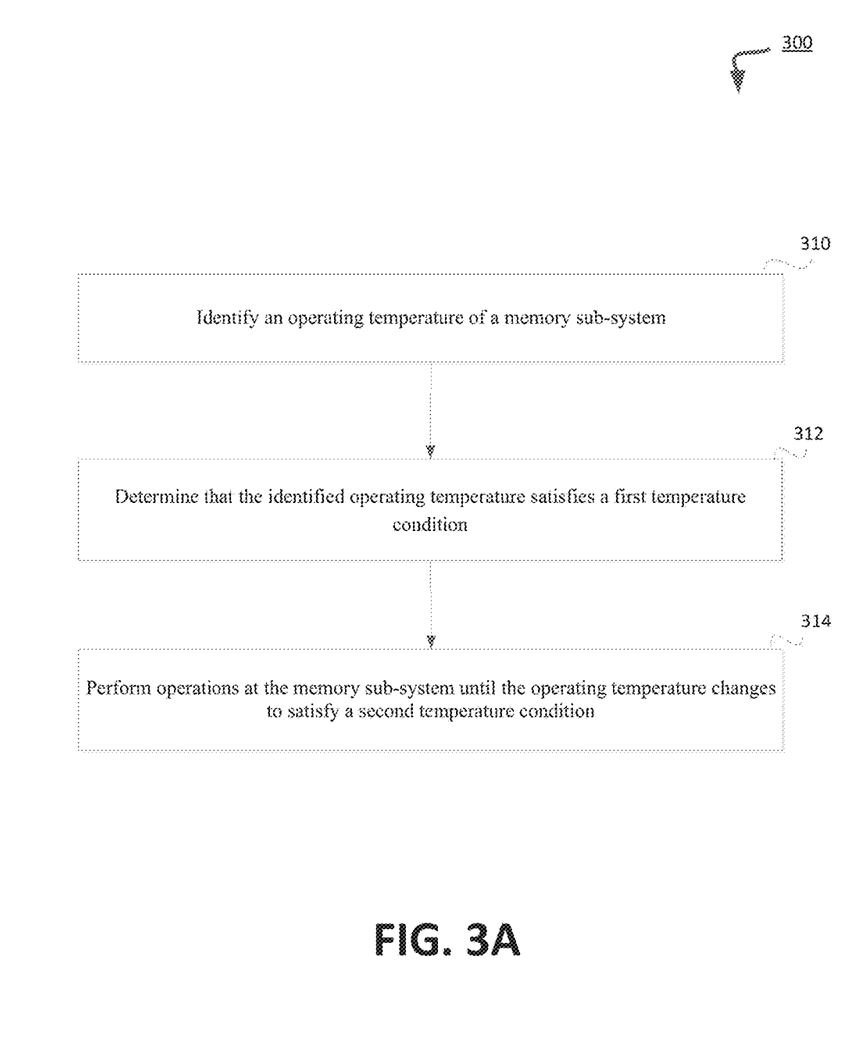
FIG. 3A is a flow diagram of an example method for managing operating temperature of a memory sub-system in accordance with some embodiments of the present disclosure.

FIG. 3A is a flow diagram of an example method 300 for managing operating temperature of a memory sub-system, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the temperature management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, the processing device identifies an operating temperature of a memory sub-system. The operating temperature of a memory sub-system at a given time can be a temperature at which the memory sub-system is operating at the given time. In some examples, a temperature sensor can be configured to periodically and/or at predefined intervals measure the operating temperature and to provide an indication of the measured operating temperature to the memory sub-system. In other examples, the temperature sensors can measure the operating temperature responsive to one or more commands (e.g., a command to measure operating temperature) that can be sent by the memory sub-system.

At block 312, the processing device determines that the identified operating temperature satisfies a first temperature condition. In an example, the first temperature condition can be defined as the operating temperature being below a first threshold temperature. In another example, the first temperature condition can be defined as the operating temperature being above a first threshold temperature.

At block 314, the processing device performs operations at the memory sub-system until the operating temperature changes to satisfy a second temperature condition. In an example where the first temperature condition is defined as the operating temperature being above the first threshold temperature, the second temperature can be defined as the operating temperature being above the first threshold temperature. In another example where the first temperature condition is defined as the operating temperature being below the first threshold temperature, the second temperature can be defined as the operating temperature being below the first threshold temperature. In an implementation, performing one or more operations at the memory sub-system can include performing the one or more operations on a data block at a memory component of the memory sub-system. For example, the operations can include a read operation associated with the data block at the memory component, a write operation associated with the data block at the memory component, and/or an erase operation associated with the data block at the memory component. In some examples, the type of operation performed can be based on a level of difference between the identified operating temperature and the first threshold temperature. In another implementation, performing the one or more operations at the memory sub-system can include performing an operation associated with a temperature control element that is proximate to a memory component of the memory sub-system.

Figure 3B:
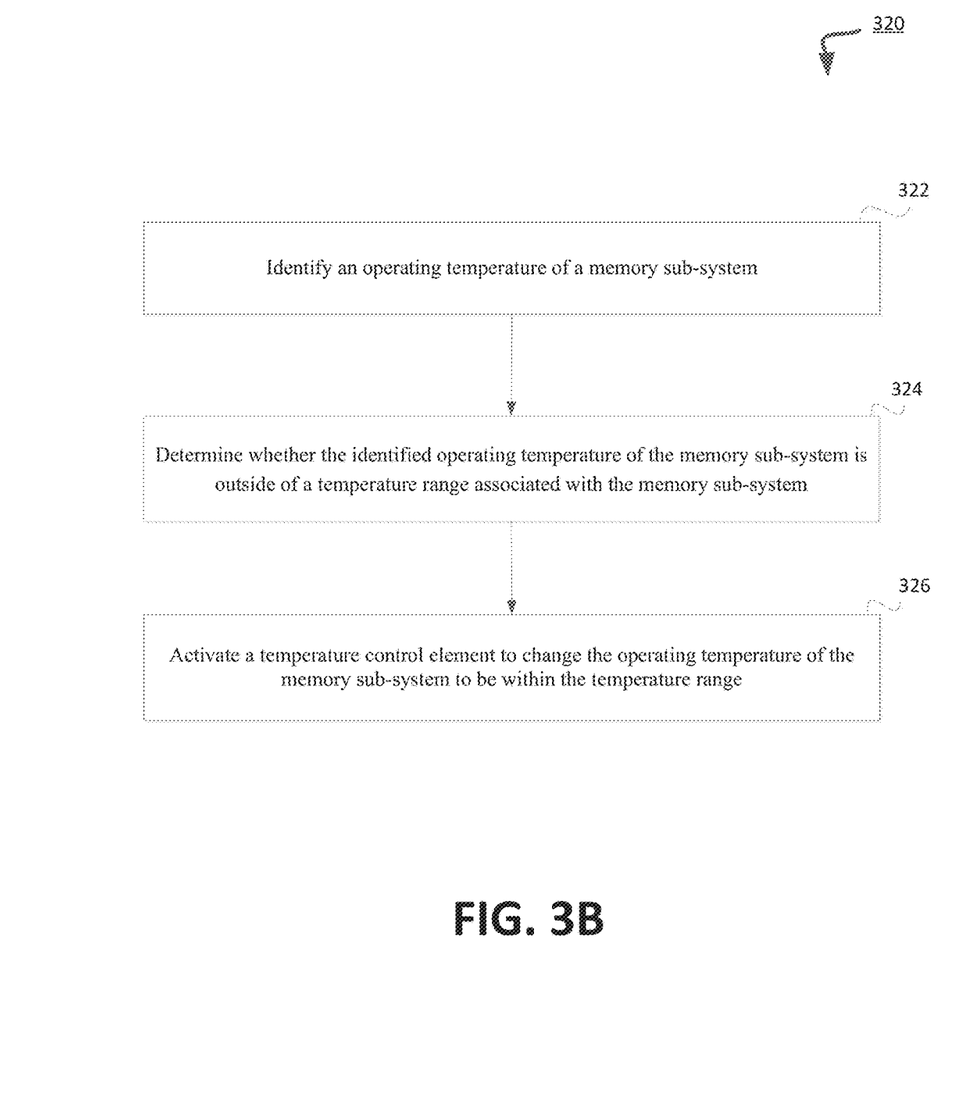
FIG. 3B is a flow diagram of an example method for activating a temperature control element in accordance with some embodiments of the present disclosure.

FIG. 3B is a flow diagram of an example method 320 for activating a temperature control element, in accordance with some embodiments of the present disclosure. The method 320 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 320 is performed by the temperature management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 322, the processing device identifies an operating temperature of a memory sub-system. The operating temperature of a memory sub-system at a given time can be a temperature at which the memory sub-system is operating at the given time. In some examples, a temperature sensor can be configured to periodically and/or at predefined intervals measure the operating temperature and to provide an indication of the measured operating temperature to the memory sub-system. In other examples, the temperature sensors can measure the operating temperature responsive to one or more commands (e.g., a command to measure operating temperature) that can be sent by the memory sub-system.

At block 324, the processing device determines whether the identified operating temperature of the memory sub-system is outside of a temperature range associated with the memory sub-system. In an example, the identified operating temperature of the memory sub-system is determined to be outside of the temperature range associated with the memory sub-system if it is determine that the identified operating temperature is below a first threshold temperature or above a second threshold temperature.

At block 326, the processing device activates a temperature control element to change the operating temperature of the memory sub-system to be within the temperature range. In an example, to activate the temperature control element, the processing device can perform an operation associated with the temperature control element that is proximate to the memory component of the memory sub-system. In an example where the identified operating temperature is below the first threshold temperature, an operation associated with the temperature control element can be performed until the operating temperature of the memory sub-system is above the first threshold temperature. In another example where the identified operating temperature is above the second threshold temperature, an operation associated with the temperature control element can be performed until the operating temperature of the memory sub-system is below the first threshold temperature.

Figure 4:
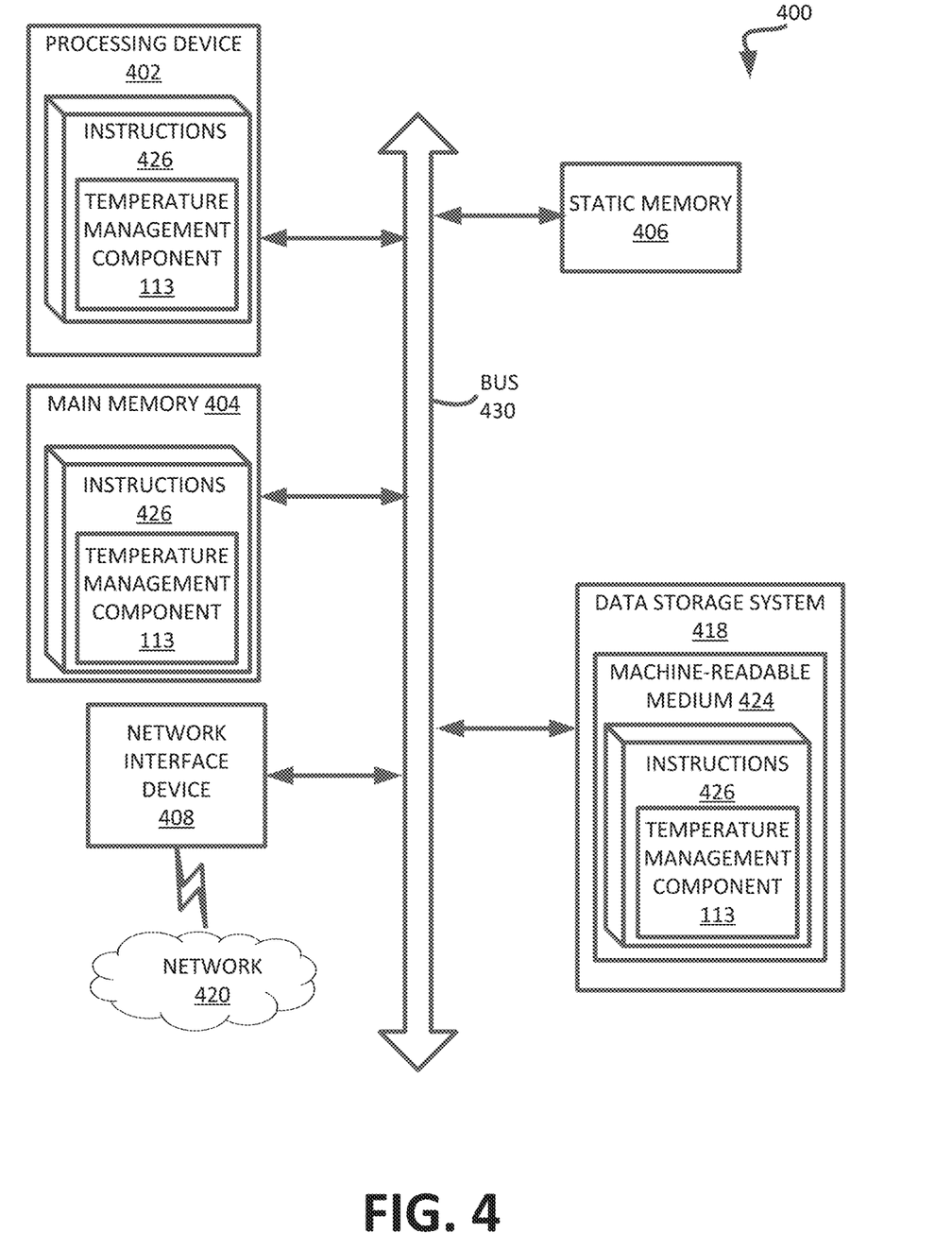
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a temperature management component (e.g., the temperature management component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory component of a memory sub-system; and
    a processing device, operatively coupled with the memory component, to:
        identify an operating temperature of the memory sub-system;
        determine that the operating temperature satisfies a first temperature condition outside of a temperature range defined by a first threshold temperature and a second threshold temperature; and
        upon determining that the operating temperature satisfies the first temperature condition, perform one or more operations at the memory sub-system until the operating temperature changes to satisfy a second temperature condition within the temperature range.

2. The system of claim 1, wherein to determine that the operating temperature satisfies the first temperature condition, the processing device is to:
    determine that the operating temperature is below the first threshold temperature, and wherein the operating temperature satisfies the second temperature condition when the operating temperature changes to be equal to or above the first threshold temperature.

3. The system of claim 1, wherein to perform the one or more operations at the memory sub-system, the processing device is to:
    perform the one or more operations on a data block at the memory component of the memory sub-system.

4. The system of claim 3, wherein to perform the one or more operations on the data block at the memory component, the processing device is to perform one or more of:
    a read operation associated with the data block at the memory component;
    a write operation associated with the data block at the memory component; or
    an erase operation associated with the data block at the memory component.

5. The system of claim 1, wherein to perform the one or more operations at the memory sub-system, the processing device is to:
    perform an operation associated with a temperature control element that is proximate to the memory component of the memory sub-system.

6. The system of claim 1, wherein to determine that the operating temperature satisfies the first temperature condition, the processing device is to determine that the operating temperature is above the second threshold temperature, and wherein to perform the one or more operations at the memory sub-system until the operating temperature satisfies the second temperature condition, the processing device is to:
perform the one or more operations until the operating temperature is equal to or below the second threshold temperature.

7. The system of claim 2, wherein the one or more operations are performed based on a difference between the operating temperature and the first threshold temperature.

8. The system of claim 1, further comprising:
a temperature sensor to detect the operating temperature of the memory sub-system.

9. The system of claim 1, further comprising:
a temperature comparator to perform a temperature comparison operation between two or more temperature values to determine whether the operating temperature satisfies the first temperature condition.

10. A method comprising:
identifying an operating temperature of a memory sub-system;
determining that the operating temperature satisfies a first temperature condition outside of a temperature range defined by a first threshold temperature and a second threshold temperature; and
upon determining that the identified operating temperature satisfies the first temperature condition, performing, by a processing device, one or more operations at the memory sub-system until the operating temperature changes to satisfy a second temperature condition within the temperature range.

11. The method of claim 10, wherein determining that the identified operating temperature satisfies the first temperature condition comprises:
determining that the operating temperature is below the first threshold temperature, and wherein the operating temperature satisfies the second temperature condition when the operating temperature changes to be equal to or above the first threshold temperature.

12. The method of claim 10, wherein performing one or more operations at the memory sub-system comprises:
performing the one or more operations on a data block at a memory component of the memory sub-system.

13. The method of claim 12, wherein performing the one or more operations on the data block at the memory component comprises performing one or more of:
a read operation associated with the data block at the memory component;
a write operation associated with the data block at the memory component; or
an erase operation associated with the data block at the memory component.

14. The method of claim 10, wherein performing the one or more operations at the memory sub-system comprises:
performing an operation associated with a temperature control element that is proximate to a memory component of the memory sub-system.

15. A non-transitory computer-readable storage medium comprising instructions that, when executed by a processing device, cause the processing device to:
identify an operating temperature of a memory sub-system;
determine that the operating temperature of the memory sub-system is outside of a temperature range associated with the memory sub-system; and
in response to determining that the operating temperature of the memory sub-system is outside of the temperature range, activate a temperature control element to change the operating temperature of the memory sub-system to be within the temperature range.

16. The non-transitory computer-readable storage medium of claim 15, wherein to activate the temperature control element, the processing device is to:
perform an operation associated with the temperature control element that is proximate to the memory component of the memory sub-system.

17. The non-transitory computer-readable storage medium of claim 15, wherein to determine that the operating temperature of the memory sub-system is outside of the temperature range associated with the memory sub-system, the processing device is to:
determine that the operating temperature is below a first threshold temperature.

18. The non-transitory computer-readable storage medium of claim 17, wherein to activate the temperature control element, the processing device is to:
perform an operation associated with the temperature control element until the operating temperature of the memory sub-system is equal to or above the first threshold temperature.

19. The non-transitory computer-readable storage medium of claim 15, wherein to determine that the operating temperature of the memory sub-system is outside of the temperature range associated with the memory sub-system, the processing device is to:
determine that the operating temperature is above a second threshold temperature.

20. The non-transitory computer-readable storage medium of claim 19, wherein to activate the temperature control element, the processing device is to:
perform an operation associated with the temperature control element until the operating temperature of the memory sub-system is equal to or below the second threshold temperature.

* * * * *